United States Patent
Yoon (10) Patent No.: US 9,859,020 B2
(45) Date of Patent: Jan. 2, 2018

(54) SEMICONDUCTOR DEVICES

(71) Applicant: SK hynix Inc., Icheon-si, Gyeonggi-do (KR)

(72) Inventor: Young Jun Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 32 days.

(21) Appl. No.: 15/057,472

(22) Filed: Mar. 1, 2016

(65) Prior Publication Data
US 2017/0103819 A1    Apr. 13, 2017

(30) Foreign Application Priority Data
Oct. 12, 2015  (KR) .................. 10-2015-0142079

(51) Int. Cl.
| | | |
|---|---|---|
| G11C 29/00 | (2006.01) | |
| G11C 29/38 | (2006.01) | |
| G11C 29/12 | (2006.01) | |
| G11C 29/48 | (2006.01) | |
| G11C 29/36 | (2006.01) | |

(52) U.S. Cl.
CPC .......... *G11C 29/38* (2013.01); *G11C 29/1201* (2013.01); *G11C 29/48* (2013.01); *G11C 29/36* (2013.01)

(58) Field of Classification Search
None
See application file for complete search history.

(56) References Cited

U.S. PATENT DOCUMENTS

| | | | | |
|---|---|---|---|---|
| 9,091,727 | B1* | 7/2015 | Lupu | G01R 31/318513 |
| 2012/0272112 | A1* | 10/2012 | Oh | H01L 23/481 |
| | | | | 714/727 |
| 2013/0093455 | A1* | 4/2013 | Whetsel | G01R 31/318541 |
| | | | | 324/762.03 |
| 2014/0021978 | A1* | 1/2014 | Ikeda | G01R 31/2889 |
| | | | | 324/762.06 |
| 2015/0067430 | A1* | 3/2015 | Lee | G11C 29/10 |
| | | | | 714/734 |

FOREIGN PATENT DOCUMENTS

KR    1020120119532 A    10/2012

* cited by examiner

*Primary Examiner* — Daniel McMahon
(74) *Attorney, Agent, or Firm* — William Park & Associates Ltd.

(57) ABSTRACT

A semiconductor device includes a test data interface, a first data interface, and a second data interface. The test data interface generates first test data and second test data from data inputted through a test pad in response to a test control signal and outputs failure information to the test pad in response to a read control signal. The first data interface generates first aligned data from the first test data or the second test data in response to the test control signal. The second data interface generates second aligned data from the second test data.

20 Claims, 11 Drawing Sheets

SEMICONDUCTOR DEVICES

CROSS-REFERENCE TO RELATED APPLICATION

The present application claims priority under 35 U.S.C 119(a) to Korean Patent Application No. 10-2015-0142079, filed on Oct. 12, 2015, which is incorporated herein by reference in its entirety.

BACKGROUND

1. Technical Field

Embodiments of the present disclosure generally relate to semiconductor devices, and more particularly, to semiconductor devices testing a data interface.

2. Related Art

A system-in-package (SiP) technique and a chip-on-chip (CoC) technique have been widely used as packaging techniques for putting a large capacity of memory chip and a controller chip in a single package. The system-in-package (SiP) technique may use a wire bonding process to electrically connect a plurality of chips to each other. The chip-on-chip (CoC) technique may be a packaging technique which is suitable for increase of a memory capacity in a single package and for improvement of a data transmission speed between the memory chip and the controller chip in a single package. This is because the memory chip and the controller chip in the package communicate with each other through micro-bump pads.

The micro-bump pads may exhibit an excellent resistance characteristic, an excellent inductance characteristic and an excellent parasitic capacitance characteristic to allow the packages to operate at a high frequency. Thus, a data transmission speed may be improved by increasing the number of the micro-bump pads employed in the package. In the chip-on-chip (CoC) package, each of the memory chips and the controller chips may be fabricated to include the micro-bump pads, and the micro-bump pads of the memory chip may be combined with the micro-bump pads of the controller chip to produce a single unified chip including the memory chips and the controller chips.

In semiconductor memory devices, test operations may be executed to verify the functions of buffers or drivers through which data are inputted or outputted. When semiconductor packages fabricated using the chip-on-chip (CoC) technique are tested, data may be inputted or outputted through the micro-bump pads of the semiconductor packages.

SUMMARY

Various embodiments may be directed to semiconductor devices testing a data interface unit.

According to an embodiment, a semiconductor device may include a test data interface, a first data interface, and a second data interface. The test data interface may generate first test data and second test data from data inputted through a test pad in response to a test control signal and outputs failure information to the test pad in response to a read control signal. The first data interface may generate first aligned data from the first test data or the second test data in response to the test control signal. The second data interface may generate second aligned data from the second test data.

According to an embodiment, a semiconductor device may include a test strobe signal interface, a first strobe signal interface, and a second strobe signal interface. The test strobe signal interface may generate a first test strobe signal and a second test strobe signal from a strobe signal inputted through a test pad in response to a test control signal. The first strobe signal interface may generate a first data strobe signal from the first test strobe signal or the second test strobe signal in response to the test control signal. The second strobe signal interface may generate a second data strobe signal from the second test strobe signal.

According to an embodiment, a semiconductor device may include a test data interface configured for generating first test data and second test data from data inputted through a first test pad in response to a test control signal. The semiconductor device may include a test strobe signal interface configured for generating a first test strobe signal and a second test strobe signal from a strobe signal inputted through a second test pad in response to the test control signal. The semiconductor device may include a strobe signal interface configured for generating a data strobe signal from the second test strobe signal. The semiconductor device may include a first data interface configured for generating first aligned data from the first test data or the second test data in response to the test control signal. The semiconductor device may include a second data interface configured for generating second aligned data from the second test data. The first and second aligned data may be generated in synchronization with the data strobe signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
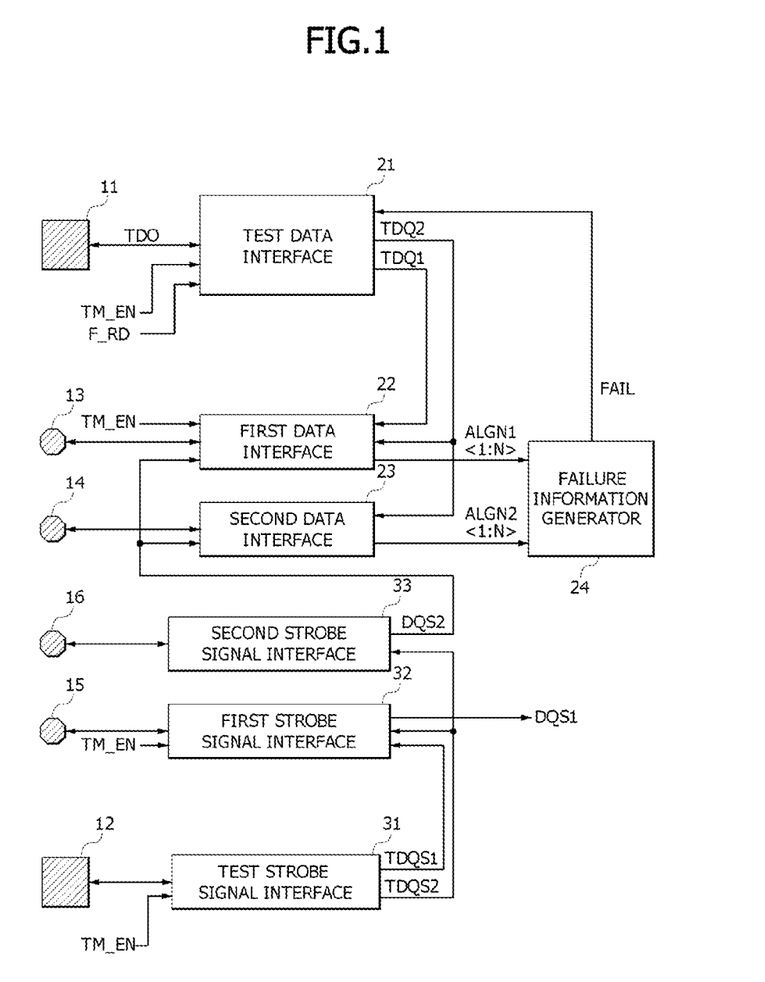
FIG. 1 is a block diagram illustrating a representation of an example of a semiconductor device according to an embodiment.

Referring to FIG. 1, a semiconductor device according to an embodiment may include a first test pad 11, a second test pad 12, a first pad 13, a second pad 14, a third pad 15, a fourth pad 16, a test data interface 21, a first data interface 22, a second data interface 23, a failure information generator 24, a test strobe signal interface 31, a first strobe signal interface 32 and a second strobe signal interface 33. In some embodiments, the first to fourth pads 13, 14, 15 and 16 may be micro bump pads.

The test data interface 21 may generate first test data TDQ1 and second test data TDQ2 from data inputted through the first test pad 11 in response to a test control signal TM_EN. For example, the test data interface 21 may generate the first test data TDQ1 and the second test data TDQ2 from the data inputted through the first test pad 11 if the test control signal TM_EN is enabled, and the test data interface 21 may terminate generating the second test data TDQ2 from the data inputted through the first test pad 11 if the test control signal TM_EN is disabled. The test control signal TM_EN may be generated from an external device or from an internal circuit of the semiconductor device. The test data interface 21 may output failure information FAIL to the first test pad 11 in response to a read control signal F_RD. The read control signal F_RD may be generated from an external device or from an internal circuit of the semiconductor device. For example, the test data interface 21 may output the failure information FAIL to the first test pad 11 if the read control signal F_RD is enabled, and the test data interface 21 may output internal data TDO to the first test pad 11 if the read control signal F_RD is disabled. The failure information FAIL may include information on a normality/abnormality of the first data interface 22 and a normality/abnormality of the second data interface 23. The failure information FAIL may be enabled if failure occurs in the first data interface 22 and/or the second data interface 23. A logic level of the enabled failure information FAIL may be set to be different according to the embodiments. The internal data TDO may be outputted from a memory cell array (not illustrated) of the semiconductor device for execution of a read operation in a normal mode while the test control signal TM_EN and the read control signal F_RD are disabled. A configuration and an operation of the test data interface 21 will be described with reference to FIG. 2 later.

The first data interface 22 may be electrically connected to the first pad 13. The first data interface 22 may receive the first test data TDQ1 or the second test data TDQ2 in response to the test control signal TM_EN to generate first aligned data ALGN1<1:N> in synchronization with a second data strobe signal DQS2. For example, the first data interface 22 may receive the second test data TDQ2 to generate the first aligned data ALGN1<1:N> in synchronization with the second data strobe signal DQS2 if the test control signal TM_EN is enabled, and the first data interface 22 may receive the first test data TDQ1 to generate the first aligned data ALGN1<1:N> in synchronization with the second data strobe signal DQS2 if the test control signal TM_EN is disabled. In some embodiments, the first data interface 22 may be configured to generate the first aligned data ALGN1<1:N> in synchronization with a first data strobe signal DQS1. A configuration and a operation of the first data interface 22 will be described with reference to FIG. 3 later.

The second data interface 23 may be electrically connected to the second pad 14. The second data interface 23 may receive the second test data TDQ2 to generate second aligned data ALGN2<1:N> in synchronization with the second data strobe signal DQS2. For example, the second data interface 23 may generate the second aligned data ALGN2<1:N> in synchronization with the second data strobe signal DQS2 if the test control signal TM_EN is enabled so that the second test data TDQ2 is generated. In some embodiments, the second data interface 23 may be configured to generate the second aligned data ALGN2<1:N> in synchronization with the first data strobe signal DQS1. A configuration and a operation of the second data interface 23 will be described with reference to FIG. 4 later.

The failure information generator 24 may receive the first and second aligned data ALGN1<1:N> and ALGN2<1:N> to generate the failure information FAIL. For example, the failure information generator 24 may generate the failure information FAIL which is enabled if the first aligned data ALGN1<1:N> are different from the second aligned data ALGN2<1:N>. The number "N" of bits of the first and second aligned data ALGN1<1:N> and ALGN2<1:N> may be set to be different according to the embodiments. A configuration and a operation of the failure information generator 24 will be described with reference to FIG. 5 later.

The test strobe signal interface 31 may generate a first test strobe signal TDQS1 and a second test strobe signal TDQS2 from a strobe signal inputted through the second test pad 12 in response to the test control signal TM_EN. For example, the test strobe signal interface 31 may generate the first test strobe signal TDQS1 and the second test strobe signal TDQS2 from the strobe signal inputted through the second test pad 12 if the test control signal TM_EN is enabled, and the test strobe signal interface 31 may terminate generating the second test strobe signal TDQS2 from the strobe signal inputted through the second test pad 12 if the test control signal TM_EN is disabled. A configuration and a operation of the test strobe signal interface 31 will be described with reference to FIG. 7 later.

The first strobe signal interface 32 may be electrically connected to the third pad 15. The first strobe signal interface 32 may receive the first and second test strobe signals TDQS1 and TDQS2 in response to the test control signal TM_EN to generate the first data strobe signal DQS1. For example, the first strobe signal interface 32 may receive the second test strobe signal TDQS2 to generate the first data strobe signal DQS1 if the test control signal TM_EN is enabled, and the first strobe signal interface 32 may receive the first test strobe signal TDQS1 to generate the first data strobe signal DQS1 if the test control signal TM_EN is disabled. A configuration and a operation of the first strobe signal interface 32 will be described with reference to FIG. 8 later.

The second strobe signal interface 33 may be electrically connected to the fourth pad 16. The second strobe signal interface 33 may receive the second test strobe signal TDQS2 to generate the second data strobe signal DQS2. For example, the second strobe signal interface 33 may generate the second data strobe signal DQS2 if the test control signal TM_EN is enabled so that the second test strobe signal TDQS2 is generated. A configuration and a operation of the second strobe signal interface 33 will be described with reference to FIG. 9 later.

Figure 2:
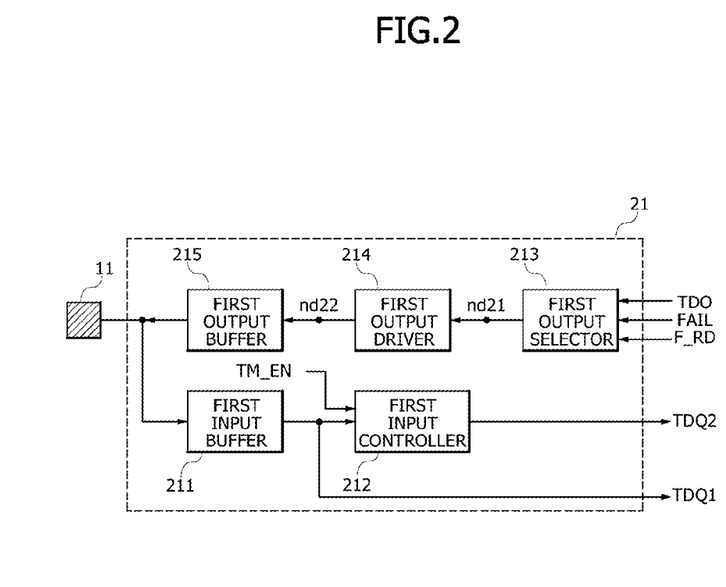
FIG. 2 is a block diagram illustrating a representation of an example of a test data interface included in the semiconductor device of FIG. 1.

Referring to FIG. 2, the test data interface 21 may include a first input buffer 211, a first input controller 212, a first output selector 213, a first output driver 214 and a first output buffer 215.

The first input buffer 211 may receive data through the first test pad 11 and may buffer the data to generate the first test data TDQ1. The first input controller 212 may generate the second test data TDQ2 from the first test data TDQ1 in response to the test control signal TM_EN. For example, the first input controller 212 may buffer the first test data TDQ1 to generate the second test data TDQ2 if the test control signal TM_EN is enabled, and the first input controller 212 may terminate generating the second test data TDQ2 if the test control signal TM_EN is disabled.

The first output selector 213 may output the internal data TDO or the failure information FAIL to a node nd21 in response to the read control signal F_RD. For example, the first output selector 213 may output the failure information FAIL to the node nd21 the read control signal F_RD is enabled, and the first output selector 213 may output the internal data TDO to the node nd21 if the read control signal F_RD is disabled. The internal data TDO may be outputted from a memory cell array (not illustrated) of the semiconductor device for execution of a read operation in a normal mode while the test control signal TM_EN and the read control signal F_RD are disabled. The first output driver 214 may drive a node nd22 in response to an output signal of the first output selector 213. The first output buffer 215 may buffer a signal of the node nd22 to output the buffered signal to the first test pad 11.

Figure 3:
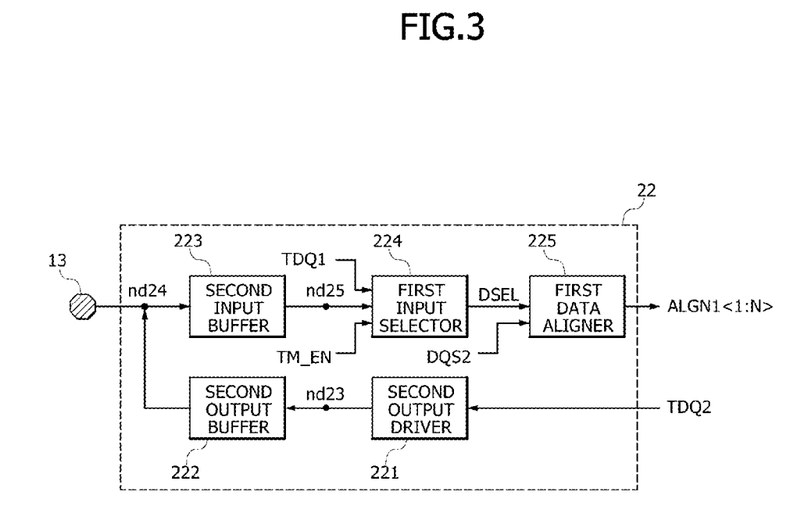
FIG. 3 is a block diagram illustrating a representation of an example of a first data interface included in the semiconductor device of FIG. 1.

Referring to FIG. 3, the first data interface 22 may include a second output driver 221, a second output buffer 222, a second input buffer 223, a first input selector 224 and a first data aligner 225.

The second output driver 221 may drive a node nd23 in response to the second test data TDQ2. The second output buffer 222 may buffer a signal of the node nd23 to output the buffered signal to a node nd24 connected to the first pad 13. The second input buffer 223 may buffer a signal of the node nd24 to output the buffered signal to a node nd25. The first input selector 224 may output the first test data TDQ1 or a signal of the node nd25 as selection data DSEL in response to the test control signal TM_EN. For example, the first input selector 224 may output the signal of the node nd25 as the selection data DSEL if the test control signal TM_EN is enabled, and the first input selector 224 may output the first test data TDQ1 as the selection data DSEL if the test control signal TM_EN is disabled. The first data aligner 225 may align the selection data DSEL in synchronization with the second data strobe signal DQS2 to generate the first aligned data ALGN1<1:N>.

Figure 4:
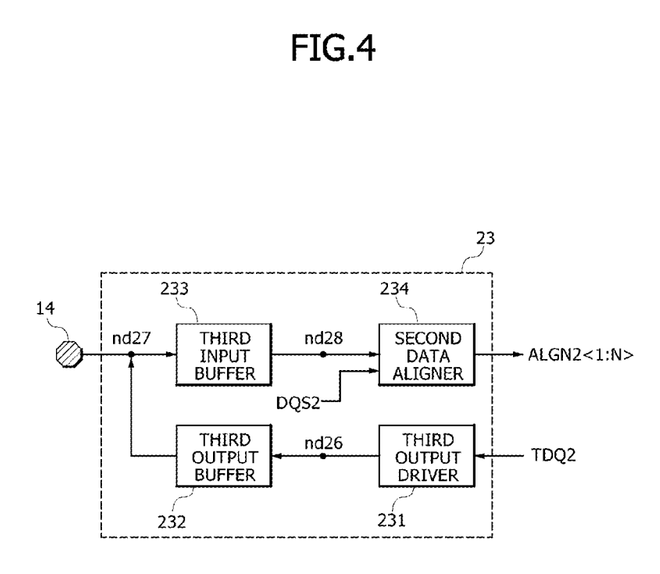
FIG. 4 is a block diagram illustrating a representation of an example of a second data interface included in the semiconductor device of FIG. 1.

Referring to FIG. 4, the second data interface 23 may include a third output driver 231, a third output buffer 232, a third input buffer 233 and a second data aligner 234.

The third output driver 231 may drive a node nd26 in response to the second test data TDQ2. The third output buffer 232 may buffer a signal of the node nd26 to output the buffered signal to a node nd27 connected to the second pad 14. The third input buffer 233 may buffer a signal of the node nd27 to output the buffered signal to a node nd28. The second data aligner 234 may align a signal of the node nd28 in synchronization with the second data strobe signal DQS2 to generate the second aligned data ALGN2<1:N>.

Figure 5:
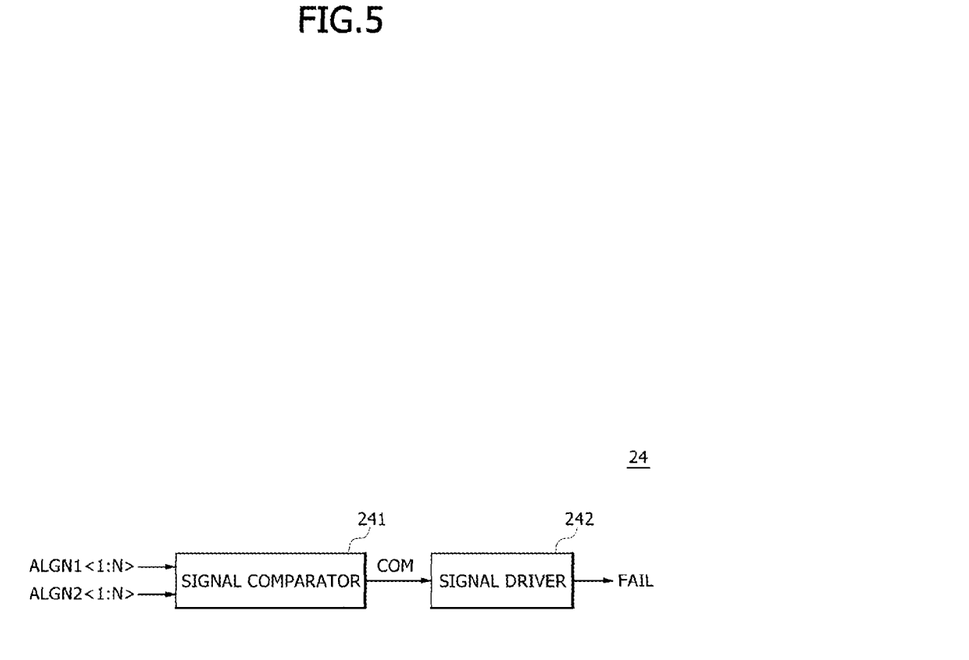
FIG. 5 is a block diagram illustrating a representation of an example of a failure information generator included in the semiconductor device of FIG. 1.

Referring to FIG. 5, the failure information generator 24 may include a signal comparator 241 and a signal driver 242.

The signal comparator 241 may compare the first aligned data ALGN1<1:N> with the second aligned data ALGN2<1:N> to generate a comparison signal COM. For example, the signal comparator 241 may generate the comparison signal COM having a logic "high" level if the first aligned data ALGN1<1:N> coincide with the second aligned data ALGN2<1:N>, and the signal comparator 241 may generate the comparison signal COM having a logic "low" level if the first aligned data ALGN1<1:N> are different from the second aligned data ALGN2<1:N>. Logic levels of the comparison signal COM according to comparison results of the first and second aligned data ALGN1<1:N> and ALGN2<1:N> may be set to be different according to the embodiments. The signal driver 242 may generate the failure information FAIL in response to the comparison signal COM. The signal driver 242 may generate the failure information FAIL which is enabled in synchronization with a point of time that a logic level of the comparison signal COM changes from a logic "high" level into a logic "low" level. A logic level of the enabled failure information FAIL may be set to be different according to the embodiments.

Figure 6:
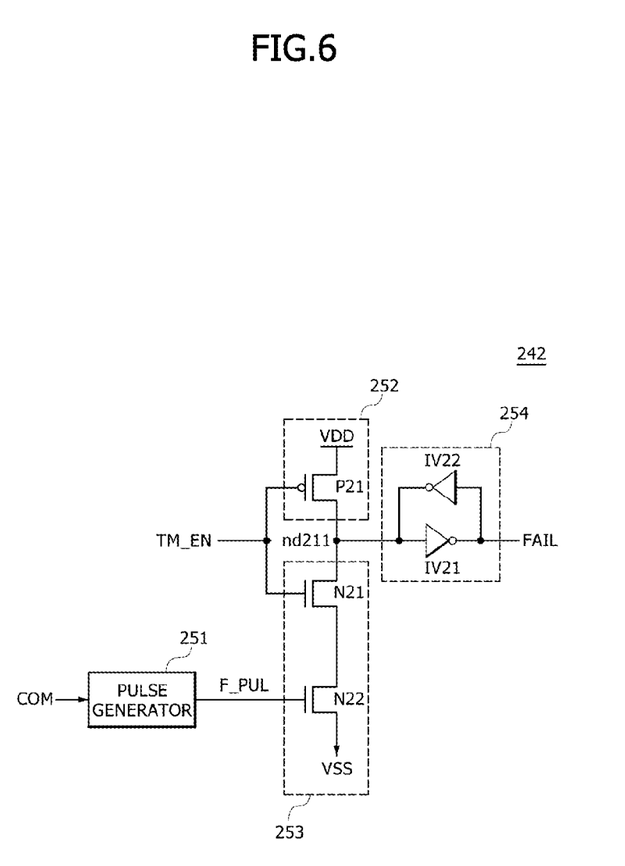
FIG. 6 illustrates a representation of an example of a signal driver included in the failure information generator of FIG. 5.

Referring to FIG. 6, the signal driver 242 may include a pulse generator 251, a pull-up driver 252, a pull-down driver 253 and a latch output circuit 254.

The pulse generator 251 may generate a pulse signal F_PUL in response to the comparison signal COM. For example, the pulse generator 251 may generate the pulse signal F_PUL including a pulse which is created in synchronization with a point of time that a logic level of the comparison signal COM changes from a logic "high" level into a logic "low" level. The pull-up driver 252 may include a PMOS transistor P21 coupled between a power supply voltage VDD terminal and a node nd211 and may drive the node nd211 to the power supply voltage VDD in response to the test control signal TM_EN. The node nd211 may be pulled up to have the power supply voltage VDD if the test control signal TM_EN is disabled to have a logic "low" level so that the PMOS transistor P21 is turned on. The pull-down driver 253 may include NMOS transistors N21 and N22 coupled in series between the node nd211 and a ground voltage VSS terminal and may pull down the node nd211 to the ground voltage VSS in response to the test control signal TM_EN and the pulse signal F_PUL. The latch output circuit 254 may latch a signal of the node nd211 and may inversely buffer the signal of the node nd211 to generate the failure information FAIL. The latch output circuit 254 may include an inverter IV21 coupled to an inverter IV22. The inverter IV22 may be configured to receive a signal from the node nd211 and an output of an inverter IV22. The inverter IV22 may be configured to receive the output of the inverter IV21.

Figure 7:
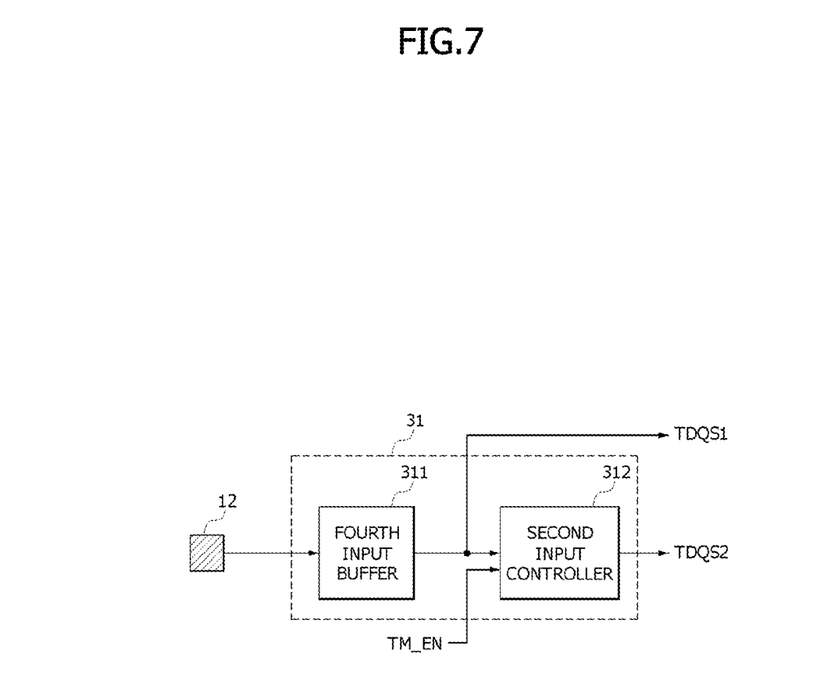
FIG. 7 is a block diagram illustrating a representation of an example of a test strobe signal interface included in the semiconductor device of FIG. 1.

Referring to FIG. 7, the test strobe signal interface 31 may include a fourth input buffer 311 and a second input controller 312.

The fourth input buffer 311 may receive the strobe signal through the second test pad 12 and may buffer the strobe signal to generate the first test strobe signal TDQS1. The second input controller 312 may generate the second test strobe signal TDQS2 from the first test strobe signal TDQS1 in response to the test control signal TM_EN. For example, the second input controller 312 may buffer the first test strobe signal TDQS1 to generate the second test strobe signal TDQS2 if the test control signal TM_EN is enabled, and the second input controller 312 may terminate generating the second test strobe signal TDQS2 if the test control signal TM_EN is disabled.

Figure 8:
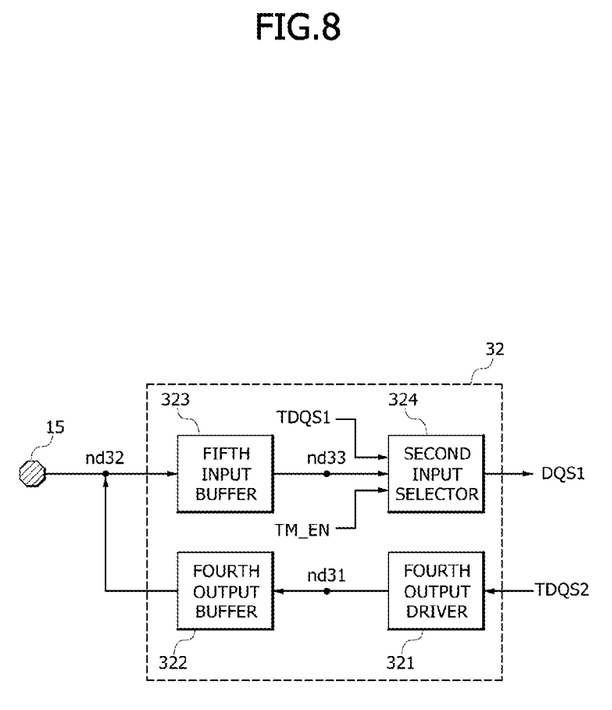
FIG. 8 is a block diagram illustrating a representation of an example of a first strobe signal interface included in the semiconductor device of FIG. 1.

Referring to FIG. 8, the first strobe signal interface 32 may include a fourth output driver 321, a fourth output buffer 322, a fifth input buffer 323 and a second input selector 324.

The fourth output driver 321 may drive a node nd31 in response to the second test strobe signal TDQS2. The fourth output buffer 322 may buffer a signal of the node nd31 to output the buffered signal to a node nd32 connected to the third pad 15. The fifth input buffer 323 may buffer a signal of the node nd32 to output the buffered signal to a node nd33. The second input selector 324 may output the first test strobe signal TDQS1 or a signal of the node nd33 as the first data strobe signal DQS1 in response to the test control signal TM_EN. For example, the second input selector 324 may output the signal of the node nd33 as the first data strobe signal DQS1 if the test control signal TM_EN is enabled, and the second input selector 324 may output the first test strobe signal TDQS1 as the first data strobe signal DQS1 if the test control signal TM_EN is disabled.

Figure 9:
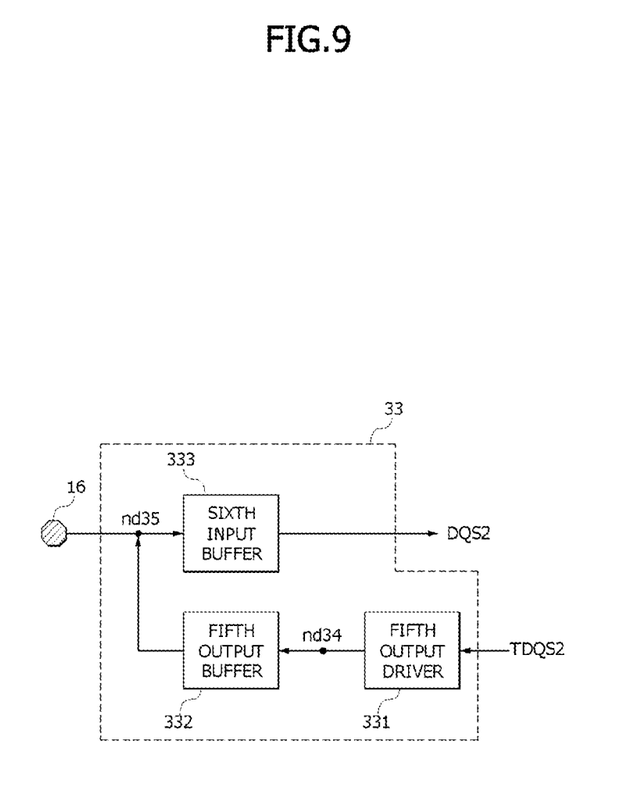
FIG. 9 is a block diagram illustrating a representation of an example of a second strobe signal interface included in the semiconductor device of FIG. 1.

Referring to FIG. 9, the second strobe signal interface 33 may include a fifth output driver 331, a fifth output buffer 332 and a sixth input buffer 333.

The fifth output driver 331 may drive a node nd34 in response to the second test strobe signal TDQS2. The fifth output buffer 332 may buffer a signal of the node nd34 to output the buffered signal to a node nd35 connected to the fourth pad 16. The sixth input buffer 333 may buffer a signal of the node nd35 to output the buffered signal as the second data strobe signal DQS2.

Figure 10:
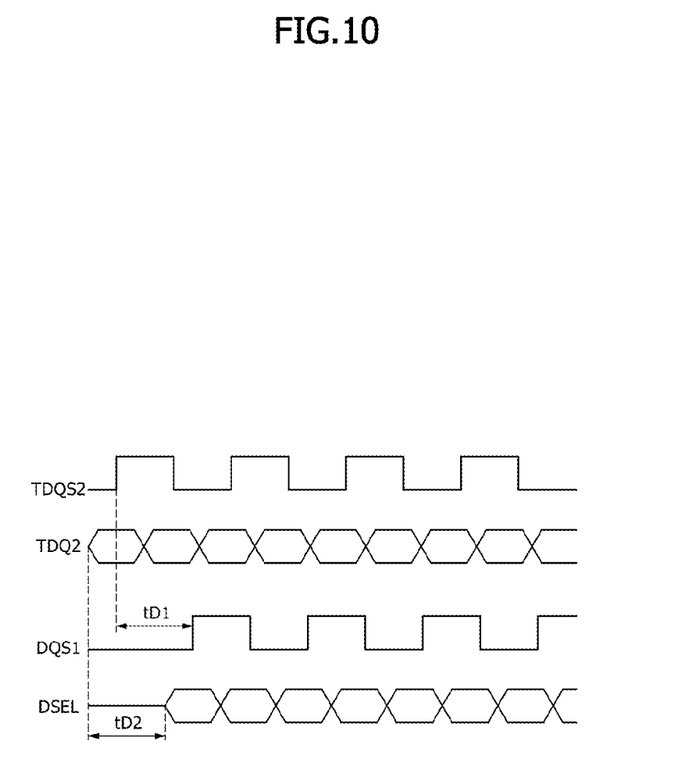
FIG. 10 is a timing diagram illustrating a representation of an example of an operation for testing setup/hold characteristics of data, which is executed in a semiconductor device according to an embodiment.

Referring to FIG. 10, the semiconductor device according to an embodiment may evaluate setup/hold characteristics of data. That is, if a first delay time tD1 necessary for generating the first data strobe signal DQS1 from the second test strobe signal TDQS2 is changed, variation of a second delay time tD2 necessary for generating the selection data DSEL from the second test data TDQ2 may be observed. Thus, setup/hold characteristics of the data inputted through the first test pad 11 can be evaluated.

Test operations of the semiconductor device having an aforementioned configuration will be described hereinafter in conjunction with an example in which the test control signal TM_EN is disabled and an example in which the test control signal TM_EN is enabled.

First, while the test control signal TM_EN is disabled, the test operation of the semiconductor device is as follows.

The test data interface 21 may generate the first test data TDQ1, and the first data interface 22 may output the first test data TDQ1 to the first pad 13. While the test control signal TM_EN is disabled, the test strobe signal interface 31 may generate the first test strobe signal TDQS1 and may terminate generating the second test strobe signal TDQS2. The first strobe signal interface 32 may output the first test strobe signal TDQS1 to the third pad 15.

Next, while the test control signal TM_EN is enabled, the test operation of the semiconductor device is as follows.

The test data interface 21 may generate the first test data TDQ1 and the second test data TDQ2 from data inputted through the first test pad 11. The test strobe signal interface 31 may generate the first test strobe signal TDQS1 and the second test strobe signal TDQS2. The second strobe signal interface 33 may generate the second data strobe signal DQS2 from the second test strobe signal TDQS2. The first data interface 22 may generate the first aligned data ALGN1<1:N> from the second test data TDQ2 in synchronization with the second data strobe signal DQS2. The second data interface 23 may generate the second aligned data ALGN2<1:N> from the second test data TDQ2 in synchronization with the second data strobe signal DQS2. The failure information generator 24 may compare the first aligned data ALGN1<1:N> with the second aligned data ALGN2<1:N> to generate the failure information FAIL. If the read control signal F_RD is enabled, the test data interface 21 may output the failure information FAIL through the first test pad 11.

Figure 11:
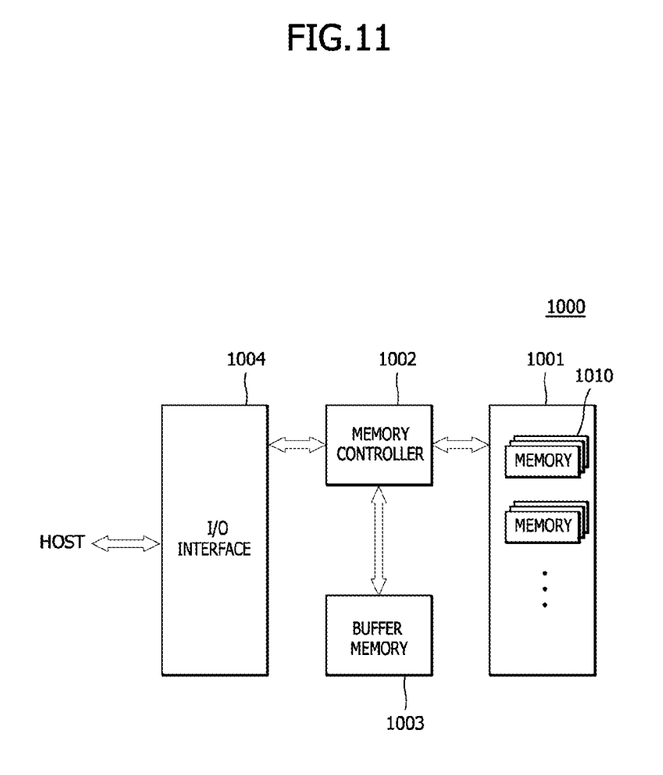
FIG. 11 is a block diagram illustrating a representation of an example of an electronic system including the semiconductor device illustrated in FIGS. 1 to 10.

The semiconductor device described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage unit 1001, a memory controller 1002, a buffer memory 1003, and an input/output (I/O) interface 1004.

The data storage unit 1001 may store data which are outputted from the memory controller 1002 or may read and output the stored data to the memory controller 1002, according to a control signal generated from the memory controller 1002. The data storage unit 1001 may include the semiconductor device illustrated in FIG. 1. The data storage unit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage unit 1001 or the buffer memory 1003 or for outputting the data stored in the data storage unit 1001 or the buffer memory 1003. Although FIG. 11 illustrates the memory controller 1002 with a single block, the memory controller 1002 may include one controller for controlling the data storage unit 1001 comprised of a nonvolatile memory and another controller for controlling the buffer memory 1003 comprised of a volatile memory.

The buffer memory 1003 may temporarily store the data, which are processed by the memory controller 1002. The buffer memory 1003 may temporarily store the data which are outputted from or to be inputted to the data storage unit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. The electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the embodiments, a normality/abnormality of a data interface unit connected to a micro bump pad may be tested using data and a data strobe signal inputted through a test pad.

In addition, according to the embodiment, setup/hold characteristics of the data inputted through the test pad may be evaluated by adjusting a point of time that the data strobe signal is inputted through the test pad.

What is claimed is:

1. A semiconductor device comprising:
a test data interface configured for generating first test data and second test data from data inputted through a test pad in response to a test control signal and configured for outputting failure information to the test pad in response to a read control signal;
a first data interface configured for generating first aligned data from the first test data or the second test data in response to the test control signal; and
a second data interface configured for generating second aligned data from the second test data,
wherein the first data interface receives the second test data to generate the first aligned data if the test control signal is enabled, and the first data interface receives the first test data to generate the first aligned data if the test control signal is disabled.

2. The semiconductor device of claim 1, wherein the failure information is enabled if the first aligned data is different from the second aligned data.

3. The semiconductor device of claim 1, wherein the test data interface buffers the first test data to generate the second test data if the test control signal is enabled.

4. The semiconductor device of claim 1, wherein the test data interface includes:
an input buffer configured for buffering the data inputted through the test pad to generate the first test data; and
an input controller configured for buffering the first test data in response to the test control signal to generate the second test data.

5. The semiconductor device of claim 1, wherein the test data interface includes:
an output selector configured for outputting internal data or the failure information to a first node in response to the read control signal;
an output driver configured for driving a second node in response to a signal of the first node; and
an output buffer configured for buffering a signal of the second node to output a buffered signal to the test pad.

6. The semiconductor device of claim 1, wherein the first data interface includes:
an input selector configured for outputting the first test data or a signal of a first node generated from the second test data as selection data in response to the test control signal; and
a data aligner configured for aligning the selection data in synchronization with a data strobe signal to generate the first aligned data.

7. The semiconductor device of claim 6, wherein the first data interface is electrically connected to a first pad and further includes:
an output driver configured for driving a second node in response to the second test data;
an output buffer configured for buffering a signal of the second node to output a buffered signal to a third node connected to the first pad; and
an input buffer configured for buffering a signal of the third node to output the buffered signal to the first node.

8. The semiconductor device of claim 1, wherein the second data interface is electrically connected to a second pad and includes:
an output driver configured for driving a first node in response to the second test data;
an output buffer configured for buffering a signal of the first node to output a buffered signal to a second node connected to the second pad;
an input buffer configured for buffering a signal of the second node to output the buffered signal to a third node; and
a data aligner configured for aligning a signal of the third node in synchronization with a data strobe signal to generate the second aligned data.

9. The semiconductor device of claim 1, further comprising:
a signal comparator configured for comparing the first aligned data with the second aligned data to generate a comparison signal; and
a signal driver configured for generating the failure information in response to the comparison signal.

10. The semiconductor device of claim 1, further comprising:
a pulse generator configured for generating a pulse signal in response to a comparison signal which is obtained by comparing the first aligned data with the second aligned data;
a pull-up driver configured for pulling up a level of an internal node in response to the test control signal; and
a pull-down driver configured for pulling down a level of the internal node in response to the test control signal and the pulse signal.

11. The semiconductor device of claim 1,
wherein the first data interface is electrically connected to a first pad,
wherein the second data interface is electrically connected to a second pad, and
wherein the first and second pads are each realized by using a micro bump pad.

12. A semiconductor device comprising:
a test strobe signal interface configured for generating a first test strobe signal and a second test strobe signal from a strobe signal inputted through a test pad in response to a test control signal;
a first strobe signal interface configured for generating a first data strobe signal from the first test strobe signal or the second test strobe signal in response to the test control signal; and
a second strobe signal interface configured for generating a second data strobe signal from the second test strobe signal,
wherein the first strobe signal interface receives the second test strobe signal to generate the first data strobe signal if the test control signal is enabled, and the first strobe signal interface receives the first test strobe signal to generate the first data strobe signal if the test control signal is disabled.

13. The semiconductor device of claim 12, wherein the test strobe signal interface buffers the first test strobe signal to generate the second test strobe signal if the test control signal is enabled.

14. The semiconductor device of claim 12, wherein the test strobe signal interface includes:

an input buffer configured for buffering the strobe signal inputted through the test pad to generate the first test strobe signal; and an input controller configured for buffering the first test strobe signal to generate the second test strobe signal in response to the test control signal.

15. The semiconductor device of claim 12, wherein the first strobe signal interface is electrically connected to a first pad and includes:

an output driver configured for driving a first node in response to the second test strobe signal;

an output buffer configured for buffering a signal of the first node to output a buffered signal to a second node connected to the first pad;

an input buffer configured for buffering a signal of the second node to output the buffered signal to a third node; and an input selector configured for outputting the first test strobe signal or a signal of the third node as the first data strobe signal in response to the test control signal.

16. The semiconductor device of claim 12, wherein the second strobe signal interface is electrically connected to a second pad and includes:

an output driver configured for driving a first node in response to the second test strobe signal;

an output buffer configured for buffering a signal of the first node to output a buffered signal to a second node connected to the second pad; and an input buffer configured for buffering a signal of the second node to output the buffered signal as the second data strobe signal.

17. The semiconductor device of claim 12, wherein the first strobe signal interface is electrically connected to a first pad, wherein the second strobe signal interface is electrically connected to a second pad, and wherein the first and second pads are each realized by using a micro bump pad.

18. A semiconductor device comprising:

a test data interface configured for generating first test data and second test data from data inputted through a first test pad in response to a test control signal;

a test strobe signal interface configured for generating a first test strobe signal and a second test strobe signal from a strobe signal inputted through a second test pad in response to the test control signal;

a strobe signal interface configured for generating a data strobe signal from the second test strobe signal;

a first data interface configured for generating first aligned data from the first test data or the second test data in response to the test control signal; and a second data interface configured for generating second aligned data from the second test data, wherein the first and second aligned data are generated in synchronization with the data strobe signal, wherein the first data interface receives the second test data to generate the first aligned data if the test control signal is enabled, and the first data interface receives the first test data to generate the first aligned data if the test control signal is disabled.

19. The semiconductor device of claim 18, wherein the test data interface outputs failure information to the first test pad in response to a read control signal; and wherein the failure information is enabled if the first aligned data are different from the second aligned data.

20. The semiconductor device of claim 18, wherein the first data interface is electrically connected to a first pad;

wherein the second data interface is electrically connected to a second pad;

wherein the strobe signal interface is electrically connected to a third pad; and wherein the first, second and third pads are micro bump pads.

* * * * *